United States Patent
Binet et al.

(10) Patent No.: US 10,404,246 B2
(45) Date of Patent: Sep. 3, 2019

(54) NON-OSCILLATING COMPARATOR

(71) Applicants: STMicroelectronics (Grenoble 2) SAS, Grenoble (FR); STMicroelectronics (Rousset) SAS, Rousset (FR)

(72) Inventors: Vincent Binet, Aix en Provence (FR); David Chesneau, Voiron (FR)

(73) Assignees: STMICROELECTRONIC (ROUSSET) SAS, Rousset (FR); STMICROELECTRONICS (GRENOBLE 2) SAS, Grenoble (FR)

( * ) Notice: Subject to any disclaimer, the term of this patent is extended or adjusted under 35 U.S.C. 154(b) by 0 days.

(21) Appl. No.: 15/946,506

(22) Filed: Apr. 5, 2018

(65) Prior Publication Data
US 2019/0007038 A1    Jan. 3, 2019

(30) Foreign Application Priority Data

Jun. 28, 2017    (FR) ...................... 17 55922

(51) Int. Cl.
| | |
|---|---|
| *H03K 5/1252* | (2006.01) |
| *H03K 5/24* | (2006.01) |
| *H03K 3/0233* | (2006.01) |
| *H03F 3/19* | (2006.01) |
| *H03K 19/20* | (2006.01) |
| *H03K 5/00* | (2006.01) |

(52) U.S. Cl.
CPC ................ *H03K 5/24* (2013.01); *H03F 3/19* (2013.01); *H03K 3/02337* (2013.01); *H03K 5/1252* (2013.01); *H03K 19/20* (2013.01); *H03K 2005/00019* (2013.01)

(58) Field of Classification Search
CPC ...... H03K 5/24; H03K 19/20; H03K 3/02337; H03K 5/1252; H03K 2005/00019; H03F 3/19
See application file for complete search history.

(56) References Cited

U.S. PATENT DOCUMENTS

| | | | |
|---|---|---|---|
| 4,418,332 A | 11/1983 | Mefford | |
| 4,609,906 A * | 9/1986 | Wiegel | ..................... H03M 1/02 341/108 |
| 6,778,111 B1 | 8/2004 | Zhu et al. | |
| 7,397,292 B1 | 7/2008 | Potanin | |
| 2012/0126901 A1* | 5/2012 | Leung | ....................... H03L 7/08 331/17 |

FOREIGN PATENT DOCUMENTS

EP        3116127 A1    1/2017

* cited by examiner

*Primary Examiner* — Jung Kim
(74) *Attorney, Agent, or Firm* — Slater Matsil, LLP

(57) ABSTRACT

A comparison circuit includes an input interface configured to receive input signals and an output interface configured to deliver an output signal. A comparator is coupled between the input interface and the output interface. An amplifier is coupled between the input interface and the comparator. A neutralization circuit is configured to neutralize any change of state of the output signal starting from each moment in time at which the change of state of the output signal occurs and lasting for a second duration of propagation that compensates for a duration of propagation of signals within the amplifier.

22 Claims, 4 Drawing Sheets

NON-OSCILLATING COMPARATOR

CROSS-REFERENCE TO RELATED APPLICATIONS

This application claims priority to French Patent Application No. 1755922, filed on Jun. 28, 2017, which application is hereby incorporated herein by reference.

TECHNICAL FIELD

Embodiments of the invention relate to comparator devices.

BACKGROUND

FIG. 1 shows one example of a comparator CHF according to the prior art.

The comparator CHF comprises an input interface comprising the input terminals E1 and Eref and an output interface comprising an output terminal S.

The comparator additionally comprises an amplifier comprising a preamplifier device 1 and a gain amplifier denoted by reference number 2.

The preamplifier device 1 comprises inputs that are connected to the terminals E1 and Eref and outputs S11 and S12 that are connected to inputs E21 and E22 of the gain amplifier device 2, respectively.

The comparator CHF comprises a latch stage 3 comprising input terminals E31 and E32 that are connected to outputs S21 and S22, respectively, of the gain amplifier device 2. The latch stage 3 comprises an output terminal S.

The preamplifier device 1 additionally comprises a control input Ec that is connected to the terminal S.

The terminal E1 is intended to receive a signal s1 and the terminal Eref is intended to receive a reference signal s2, and the terminal S is intended to receive a signal s. The operating frequency of the comparator CHF is, for example, of the order of 200 MHz corresponding to a first duration of propagation Tp of 5 ns for the signals s1 and s2 from the inputs E1 and Eref to the output S of the comparator CHF.

The preamplifier device 1 comprises operational amplifiers operating in their linear region, close to their equilibrium point, and a hysteresis device controlled by the input Ec.

The outputs S11 and S12 deliver signals s11 and s12.

The gain amplifier device 2 generally comprises multiple amplification stages linked in cascade fashion, each stage comprising multiple operational amplifiers operating in their linear region. The operational amplifiers are generally connected in the inverting configuration known to a person skilled in the art.

The outputs S21 and S22 deliver signals s21 and s22.

The latch stage 3 generally comprises a flip-flop, a first input of which is linked to the input E31 and a second input of which is linked to the input E32. The signals s21 and s22 are applied to the inputs E31 and E32.

FIG. 2 illustrates one example of a latch stage 3 according to the prior art.

It comprises a flip-flop device 10 comprising a first steering input S1 corresponding to a first output Q1 and a second steering input R1 corresponding to a second output Qb1.

The flip-flop device 10 comprises a flip-flop, for example an RS flip-flop.

When the steering input S1 is activated, the output Q1 is a logical "1" and the output Qb1 is equal to "0". When the steering input R1 is activated, the output Qb1 is a logical "1" and the output Q1 is equal to "0".

When the inputs S1 and R1 are activated simultaneously, the outputs Q1 and Qb1 retain their state prior to the change of state of the inputs S1 and R1.

The input S1 of the flip-flop device 10 is linked to the terminal E31, the input R1 of the flip-flop device 10 is linked to the output of a NAND logic gate 6 including two inputs, a first input of which is linked to the terminal E31 and the second input of which is linked to the terminal E32. The output Qb1 of the device 10 is linked to the input of an inverter logic gate 7. The output of the logic gate 7 is linked to the output terminal S.

Depending on the relative value of the signals s1 and s2, the flip-flop delivers a signal s that is equal to a logical "1" to the output terminal S if s1 is higher than s2, otherwise the signal s is equal to a logical "0".

The latch stage 3 compares the signals s21 and S22 and converts the signal resulting from the comparison of the signals s21 and S22 to a digital signal s at the terminal S.

In order to react rapidly to small variations in the input signal s1, the high-frequency comparator CHF exhibits high gain and wide bandwidth.

The signals s1 and s2 are for example amplified by the devices 1 and 2 with a gain of around 100 dB.

This value of the output S is transmitted to the input Ec.

Since the devices 1 and 2 operate close to their equilibrium point, a very small variation in one of their inputs may cause the signal s to flip.

As such, noise in the comparator CHF may cause the output of the latch stage 3, and thus the logic state of the terminal of output S of the comparator CHF, to vary.

Since noise is by definition random, the signal s is made to oscillate, delivering a succession of logical 0s and 1s without the input signals s1 and s2 of the comparator CHF varying.

The hysteresis device incorporated in the preamplifier 1 suppresses the occurrence of the oscillations caused by noise by modifying the value of the signal s1 each time the signal s output by the comparator CHF changes state. It adds or subtracts an offset value Vdec to/from the signal s1 each time the signal s changes state. This offset value is added to s1 if the output signal s is equal to 1 or subtracted from s1 if the output signal s is equal to 0. This fixed value is known as a hysteresis value. This offset in the value of the signal s1 prevents the output S of the comparator from flipping upon each variation in the comparison signal that is less than or more than the predefined value Vdec.

However, when the oscillations resulting from noise are substantially of the same period, or of a period that is shorter than that of the first duration of propagation Tp of the signals through the comparator CHF, for example of the order of 5 ns, the signal s11 including the offset value does not have time to propagate through the comparator CHF. The output S of the comparator is then made to oscillate.

FIG. 3 illustrates the operation of the comparator CHF subject to noise on its input E1.

The signals output by the devices 1 and 2 exhibit a delay that is equal to the duration of propagation of the signals through the devices, for example the preamplifier device 1 has a duration of propagation tg.

The variations in the signal s with respect to the signal s1 output by the comparator CHF exhibit a delay that is equal to the first duration of propagation Tp. Consequently, the hysteresis value Vdec is applied to the signal s11 at the moment in time at which the signals s1 and s2 cross plus the first duration Tp. Noise occurs at time tB for a duration Tb that is shorter than the first duration of propagation Tp. Consequently, hysteresis is activated after the disturbance has passed through the comparator CHF. A variation in the signal s is observed for a duration Tb. Hysteresis has not made the comparator immune to noise.

Filtering devices, in particular digital filters placed at the output of the comparator, allow the oscillations to be filtered.

However, filtering devices require additional clocks of higher frequency than the operating frequency of the comparator in order to avoid the output of the comparator exhibiting latency, and additional circuits.

These additional elements lead to an additional power consumption of the order of twice the power consumption of the comparator CHF, and make the comparator more complex.

SUMMARY

Embodiments of the invention relate to comparator devices. Particular embodiments relate to high-frequency comparator devices used in switched-mode power supplies, for example, for controlling electric motors, battery chargers and lighting devices.

Embodiments of the invention eliminate the oscillations caused by noise in a comparator, in particular a high-frequency comparator, without introducing a delay in the signal output by the comparator and while controlling its power consumption.

According to one aspect, a method is proposed for controlling the operation of a comparator including an amplifier that is connected at the input of a comparator. The method includes neutralization of any change of state of a signal output by the comparator starting from each moment in time at which the change of state of the output signal occurs and for a second duration of propagation that is equal to a duration of propagation of signals within the amplifier.

According to another aspect, a circuit is proposed and comprises an input interface for receiving input signals, an output interface for delivering an output signal, a comparator that is coupled between the input interface and the output interface, an amplifier that is connected between the input interface and the comparator, and a neutralization circuit (i.e., compensation circuit) that is configured to neutralize any change of state of the output signal starting from each moment in time at which the change of state of the output signal occurs for a second duration of propagation that is equal to a duration of propagation of signals within the amplifier.

The second duration of propagation is for example equal to a first duration of propagation that is equal to a duration of propagation of signals within the comparator to within a certain tolerance.

The tolerance is for example between 0 and 5%.

According to another mode of implementation, the neutralization circuit includes a circuit for replicating the amplifier that is configured to have the second duration of propagation.

The duration of propagation of the signals is dependent on multiple parameters of the comparator which vary frequently. The replica circuit makes it possible to take these variations into account, unlike a fixed predetermined value that has been determined for a set of parameters.

The comparator includes, for example, a latch stage that is coupled to the output interface and the neutralization circuit is coupled to the latch stage.

According to another embodiment, the latch stage includes a flip-flop that is coupled to the output interface via a multiplexer and the neutralization circuit is coupled between the outputs and the inputs of the flip-flop.

According to one embodiment, the neutralization circuit includes the replica circuit having inputs that are coupled to the inputs of the flip-flop and logic gates that are coupled between the outputs of the replica circuit and the inputs of the flip-flop.

According to another embodiment, the amplifier includes operational amplifiers and the replica circuit includes auxiliary operational amplifiers operating analogously to the operational amplifiers to within a certain scale factor.

The replica circuit thus uses for example the architecture of the amplifier while simplifying it so as to decrease its power consumption and to decrease the area occupied thereby.

The operating frequency of the comparator is for example higher than 200 MHz, the period associated with this frequency being equal to the duration of propagation of the signal through the comparator.

BRIEF DESCRIPTION OF THE DRAWINGS

Other advantages and features of the invention will become apparent upon examining the detailed description of completely non-limiting embodiments and the appended drawings, in which.

DETAILED DESCRIPTION OF ILLUSTRATIVE EMBODIMENTS

Figure 1:
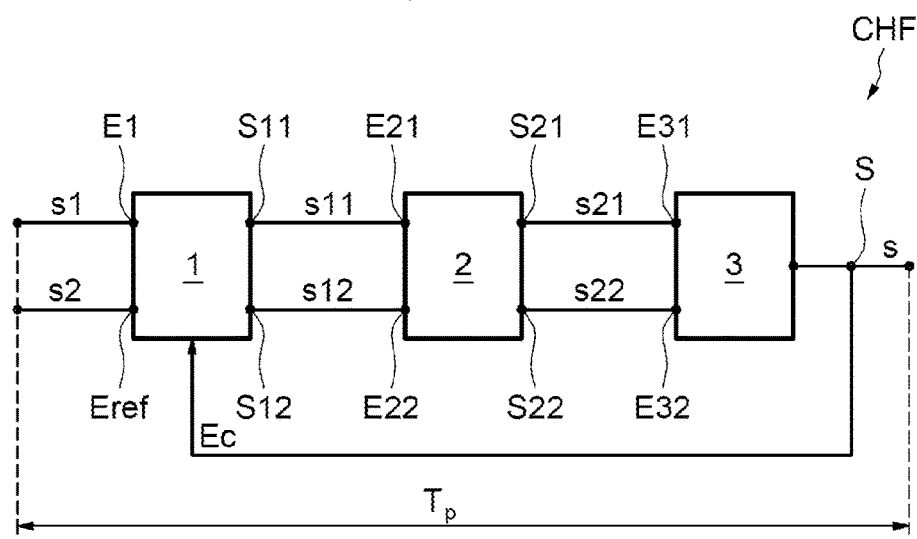
FIGS. 1 to 3, described above, illustrate embodiments of a comparator according to the prior art.
Figure 2:
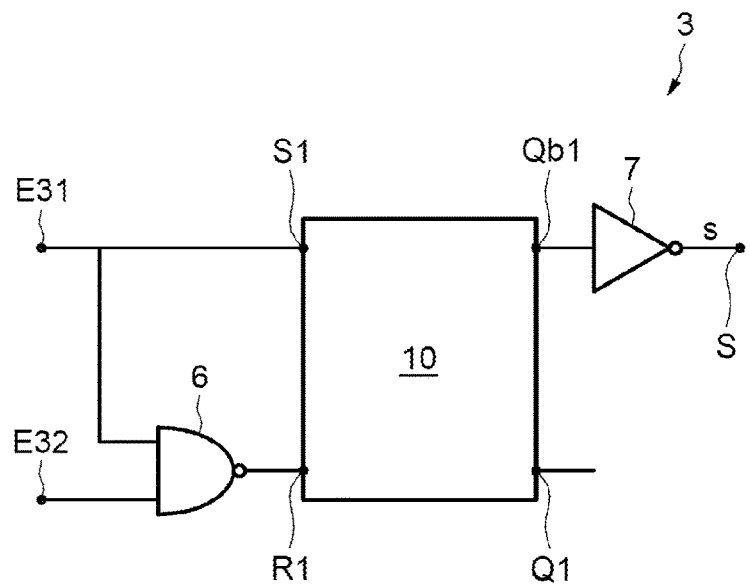
Figure 3:
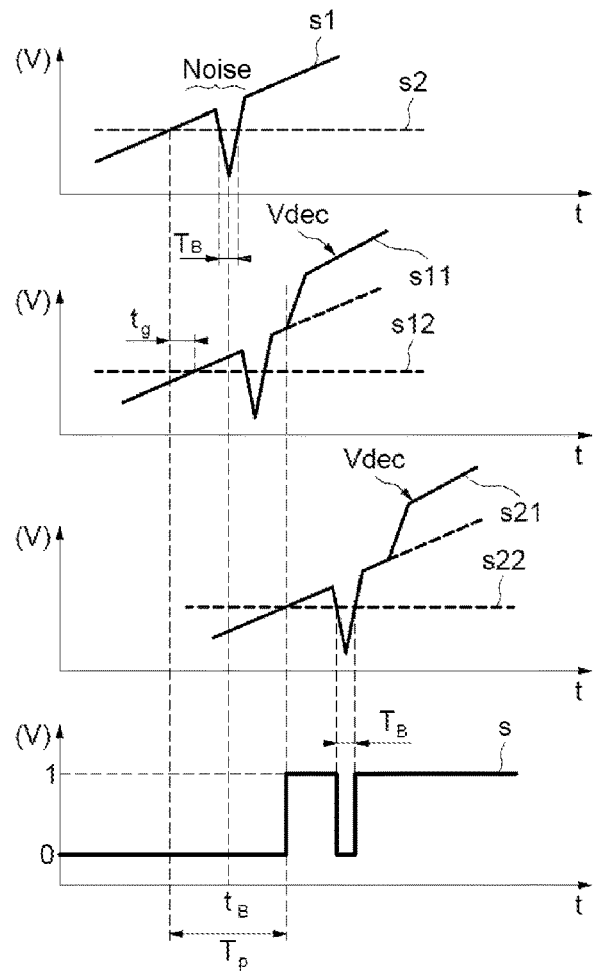
Figure 4:
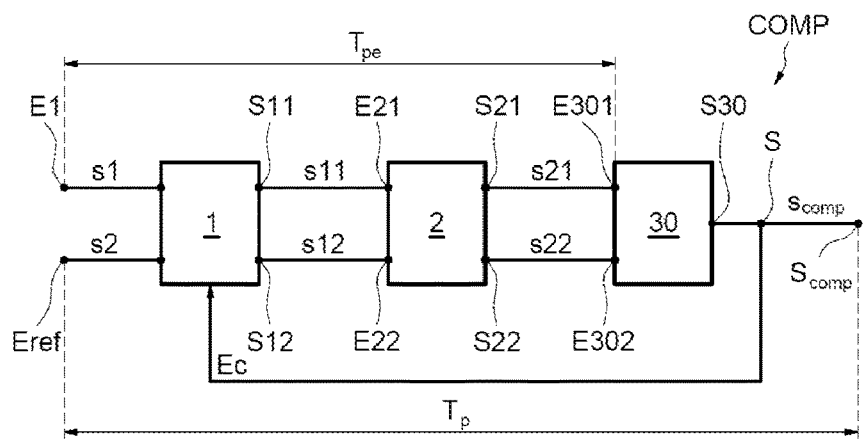
FIGS. 4 to 7 illustrate various embodiments and modes of implementation of the invention.
Figure 5:
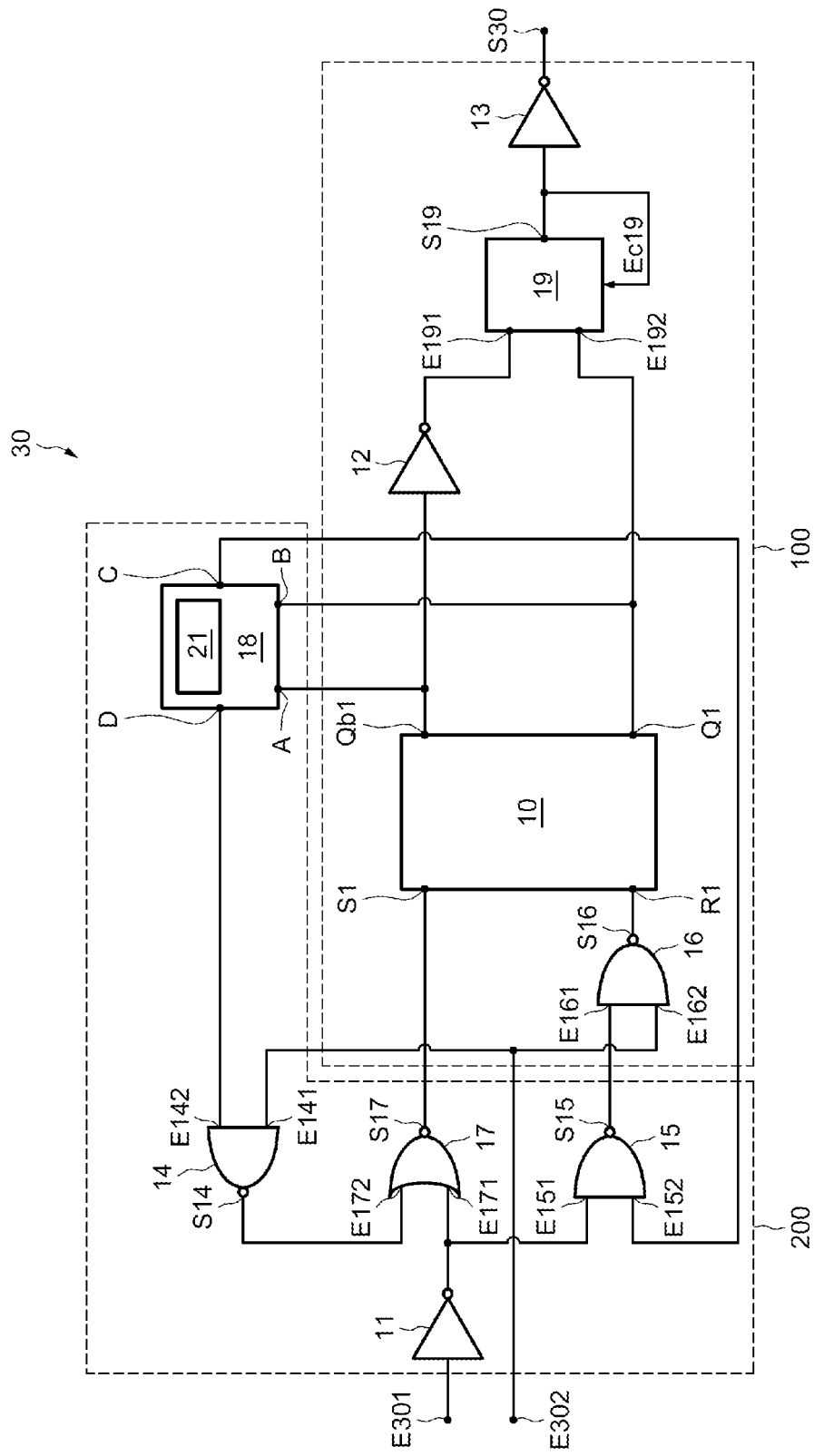

Reference is made to FIGS. 4 and 5, which show an exemplary embodiment of a comparison circuit COMP and of a latch stage 30.

These figures show the input interface comprising the terminals E1 and Eref receiving the input signals s1 and s2, the amplifier comprising the preamplifier device 1 and the gain amplifier device 2 that are linked to one another as described above.

The comparison circuit COMP additionally comprises an output interface comprising a terminal SCOMP for delivering an output signal sCOMP and a latch stage 30 comprising a first input terminal E301 that is linked to the output S21, a second input terminal E302 that is linked to the output S22 and an output terminal S30 that is linked to the output terminal SCOMP of the comparison circuit COMP and to the input Ec of the preamplifier device 1.

Advantageously, the comparison circuit COMP is an example of a high-frequency comparator of which the first duration of propagation Tp of the signals s1 and s2 at the inputs E1 and Eref is for example shorter than 5 ns. The operating frequency F of the comparison circuit COMP is equal to the inverse of the first duration of propagation Tp, and as such the comparison circuit COMP has an operating frequency that is higher than 200 MHz.

The comparison circuit COMP includes a comparator 100 that is coupled between the input interface and the output interface including the latch stage 30 that is coupled to the output interface and neutralization circuit 200 (i.e., compensation circuit 200) that is configured to neutralize any change of state of the output signal sCOMP starting from each moment in time at which the change of state of the output signal sCOMP occurs for a duration that is equal to a second duration of propagation Tpe of signals through the comparator upstream of the comparator 100 and neutralization circuit 200 to within a certain tolerance.

The duration of propagation of the signals through the comparator 100 and the neutralization circuit 200 is negligible with respect to the duration of propagation through the amplifier, and as such the duration of propagation through the comparator 100 and the neutralization circuit 200 is not taken into account in the duration of neutralization that is equal to the second duration of propagation Tpe of the change of state of the output signal sCOMP. Stated otherwise, the second duration of propagation Tpe is equal to the first duration of propagation Tp of the signals through the comparison circuit COMP to within a tolerance tol.

The tolerance tol is for example between 0 and 5%.

The neutralization circuit 200 is coupled to the latch stage 30.

The preamplifier device 1 and the gain amplifier device 2 are incorporated within the amplifier that is connected between the input interface and the comparator 100.

The amplifier includes operational amplifiers.

The neutralization circuit 200 includes a replica circuit 18 comprising a first input terminal A, a second input terminal B, a first output terminal C and a second output terminal D. The neutralization circuit 200 also includes an auxiliary amplifier 21 that is configured to have a second duration of signal propagation Tpe that is equal to the first duration of signal propagation Tp through the comparison circuit COMP upstream of the comparator 100 and neutralization circuit 200 to within a tolerance tol. Stated otherwise, the second duration Tpe is equal to the first duration Tp to within 5%.

The neutralization circuit 200 additionally comprises an inverter logic gate 11 comprising one input and one output, two NAND logic gates 14, 15 and a NOR logic gate 17, each comprising two inputs and one output.

The comparator 100 includes the flip-flop 10 that is coupled to the output interface via a multiplexer 19 comprising a first input E191, a second input E192, a control input Ec19 and an output S19 and inverter logic gates 12 and 13, each comprising one input and one output, and a NAND logic gate 16 comprising two inputs and one output.

The input E301 of the latch stage 30 is linked to the input of the inverter gate 11. A first input E171 of the gate 17 and a first input E151 of the gate 15 are linked to the output of the gate 11. The output S17 of the gate 17 is linked to the input S1 of the device 10.

The output S15 of the gate 15 is linked to a first input E161 of the gate 16 and the output S16 of the gate 16 is linked to the input R1 of the device 10.

The input E302 of the latch device 30 is linked to the second input E162 of the gate 16 and to the first input E141 of the gate 14.

The output S14 of the gate 14 is linked to the second input E172 of the gate 17.

The output S30 of the latch device 30 is linked to the output of the gate 13. The output S19 of the multiplexer 19 is linked to the input of the gate 13 and to the control input Ec19.

The output Qb1 of the flip-flop 10 is linked both to the input E191 of the multiplexer 19 via the inverter gate 12, the output of the gate 12 being linked to the input E191, and to the terminal A of the replica circuit 18.

The output Q1 of the flip-flop 10 is linked both to the input E192 of the multiplexer 19 and to the terminal B of the replica circuit 18.

The terminal C of the replica circuit 18 is linked to the second input E152 of the gate 15, and the terminal D of the replica circuit 18 is linked to the second input E142 of the gate 14.

The neutralization circuit 200 include the replica circuit 18 comprising the input terminals A and B that are coupled to the inputs of the flip-flop 10 and logic gates 11, 14, 15 and 17 that are coupled between the output terminals D and C of the replica circuit and the inputs of the flip-flop S1 and R1.

Figure 6:
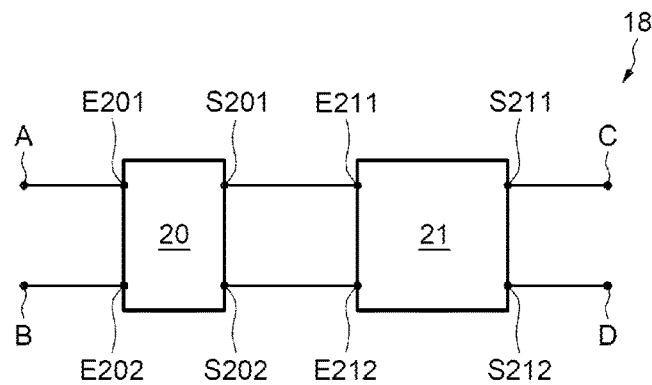

As illustrated in FIG. 6, the replica circuit 18 comprises a digital-to-analog converter 20 comprising a first input E201 that is linked to the terminal A and a second input E202 that is linked to the terminal B and two outputs S201 and S202 that are linked to the inputs E211 and E212, respectively, of the auxiliary amplifier 21 that is configured to have a second duration of signal propagation Tpe that is equal to the first duration of propagation Tp to within the tolerance tol. The auxiliary amplifier 21 comprises two outputs S211 and S212 that are linked to the terminals C and D, respectively.

The auxiliary amplifier 21 comprises auxiliary operational amplifiers that are functionally analogous to the operational amplifiers of the devices 1 and 2 to within a certain scale factor. Stated otherwise, the auxiliary operational amplifiers are configured to have a second duration of propagation Tpe that is identical, to within the tolerance tol, to the first duration of propagation Tp of signals within the devices 1 and 2 so that a current flowing therethrough is smaller than that flowing through the preamplifier device 1 and the gain amplifier device 2. A person skilled in the art would be capable of configuring the auxiliary operational amplifiers, for example by changing the value of the resistors of the inverter circuits and/or by modifying other operating parameters of the auxiliary operational amplifiers. These parameters may in particular be determined using numerical simulations on the basis of a numerical model of the high-frequency comparator CHF incorporating the latch stage 3.

The decrease in the current flowing through the auxiliary amplifier 21 makes it possible to decrease the power consumption of and the dissipation of heat from the replica circuit 18.

The digital-to-analogue converter 20 converts the digital signals that are received on the terminals A and B to analogue signals used by the auxiliary operational amplifiers that are incorporated within the auxiliary amplifier 21.

The neutralization circuit 200 neutralize any change of state of the output signal sCOMP of the comparison circuit COMP starting from each moment in time at which the change of state of the output signal occurs and for the second duration of propagation Tpe that is equal to a duration of propagation of signals within the amplifier comprising the devices 1 and 2.

Figure 7:
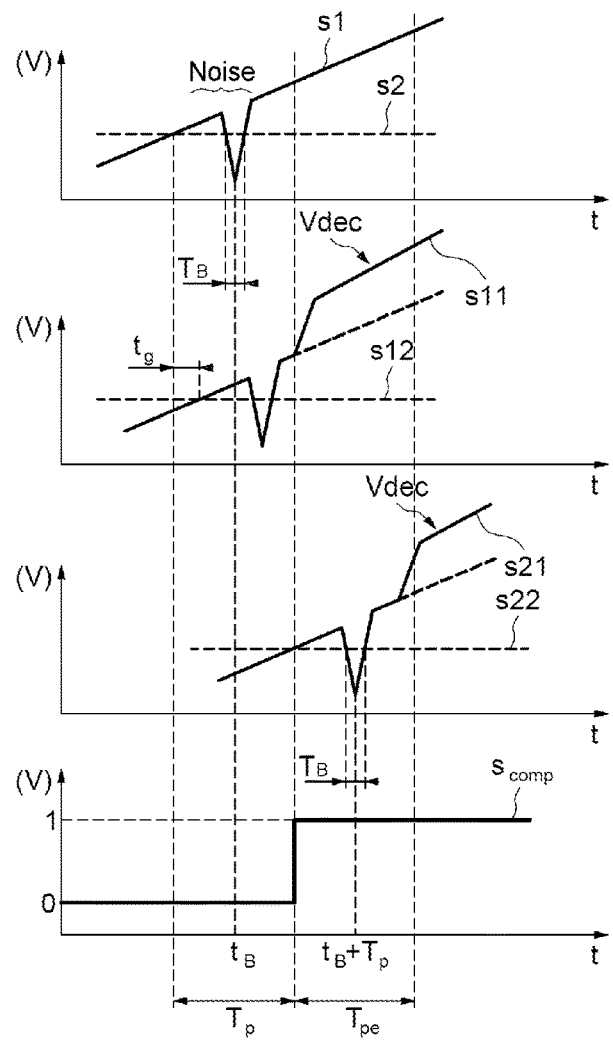

FIG. 7 illustrates the operation of an exemplary comparison circuit COMP.

It shows, at the input of the comparison circuit, the signals s1 and s2, and the noise on the signal s1 at time tB. The hysteresis device incorporated within the preamplifier modifies the output S11 of the preamplifier device 1 by adding the hysteresis value Vdec to the signal s1 after the change of state of the output signal sCOMP, as described above.

Following the change of state of the output signal sCOMP, the replica circuit 18 receives, at its inputs A and B, the change of state of the comparator 100. It neutralizes all commands from the inputs S1 and R1 of the comparator 100 for a second duration of propagation Tpe that is equal to the duration of propagation of the signals received at the inputs A and B through the auxiliary amplifier 21, by delaying the transmission of the instruction to change state to the logic gates 11, 14, 15 and 17.

The noise on the input signal s1 reaches the input of the comparator 100 at a time tB+Tp within the second duration of propagation Tpe of neutralization of the comparator. Consequently, the output of the comparator Scomp does not change state.

The replica circuit 18 does not require a clock signal and its power consumption is equal to a tenth of that of a known comparator of the prior art for a first-order approximation of the first duration of propagation Tp.

What is claimed is:

1. A comparison circuit comprising:
   an input terminal configured to receive input signals;
   an output terminal configured to deliver an output signal;
   a comparator coupled between the input terminal and the output terminal;
   an amplifier coupled between the input terminal and the comparator, the amplifier having a signal input and a reference signal input, the signal input of the amplifier coupled to the input terminal; and
   a neutralization circuit configured to neutralize any change of state of the output signal starting from each moment in time at which the change of state of the output signal occurs and lasting for a second duration of propagation that compensates for a duration of propagation of signals within the amplifier, the neutralization circuit comprising:
      logic circuitry coupled to an output of the amplifier,
      a digital to analog converter, and
      an auxiliary amplifier with an input coupled to an output of the digital to analog circuit, the auxiliary amplifier having an output coupled to the logic circuitry, wherein the comparator comprises:
         a flip-flop having an input coupled to the logic circuitry and an output coupled to an input of the digital to analog converter, and
         a multiplexer having an input coupled to the output of the flip-flop.

2. The comparison circuit according to claim 1, wherein the second duration of propagation is equal to the duration of propagation of signals within the amplifier.

3. The comparison circuit according to claim 1, wherein the second duration of propagation is equal to a first duration of propagation that is equal to a duration of propagation of signals within the comparison circuit to within a tolerance.

4. The comparison circuit according to claim 3, wherein the tolerance is between 0 and 5%.

5. The comparison circuit according to claim 1, wherein the neutralization circuit comprises a replica circuit that is configured to have the second duration of propagation, the replica circuit comprising the digital to analog converter and the auxiliary amplifier.

6. The comparison circuit according to claim 1, wherein the comparator comprises a latch stage that is coupled to the output terminal, the latch stage comprising the neutralization circuit.

7. The comparison circuit according to claim 6, wherein the neutralization circuit is coupled between outputs and inputs of the flip-flop.

8. The comparison circuit according to claim 7, wherein the neutralization circuit comprises a replica circuit that is configured to have the second duration of propagation, the replica circuit comprising the digital to analog converter and the auxiliary amplifier.

9. The comparison circuit according to claim 8, wherein the replica circuit has inputs that are coupled to the inputs of the flip-flop and logic gates that are coupled between outputs of the replica circuit and the inputs of the flip-flop.

10. The comparison circuit according to claim 8, wherein the amplifier comprises operational amplifiers and the auxiliary amplifier includes an auxiliary operational amplifier operating analogously to the operational amplifiers to within a certain scale factor.

11. The comparison circuit according to claim 1, wherein the comparison circuit has an operating frequency that is higher than 200 MHz.

12. A comparison circuit comprising:
    an amplifier having a signal input and a reference signal input;
    logic circuitry coupled to an output of the amplifier;
    a flip-flop having an input coupled to the logic circuitry;
    a digital to analog converter with an input coupled to an output of the flip-flop;
    an auxiliary amplifier with an input coupled to an output of the digital to analog circuit, the auxiliary amplifier having an output coupled to the logic circuitry; and
    a multiplexer having an input coupled to the output of the flip-flop.

13. The comparison circuit according to claim 12, wherein the auxiliary amplifier is designed to have a propagation delay that is substantially equal to a propagation delay of the amplifier.

14. The comparison circuit according to claim 12, wherein the amplifier comprises a preamplifier device coupled in series with a gain amplifier device.

15. The comparison circuit according to claim 12, wherein the comparison circuit has an operating frequency that is higher than 200 MHz.

16. The comparison circuit according to claim 12, wherein the flip-flop comprises an RS flip-flop having a set input, a reset input, an output and a complementary output, wherein the set input and the reset input are coupled to the logic circuitry and wherein the output and the complementary output are coupled to the multiplexer.

17. The comparison circuit according to claim 16, wherein the logic circuitry comprises:
    an inverter having an input coupled to a first amplifier output;
    a first NAND gate having a first input coupled to an output of the inverter and a second input coupled to a first auxiliary amplifier output;
    a second NAND gate having a first input coupled to a second amplifier output and a second input coupled to an output of the first NAND gate;
    a third NAND gate having a first input coupled to the second amplifier output and second input coupled to a second auxiliary amplifier output; and
    a NOR gate having a first input coupled to the output of the inverter and a second input coupled to an output of the third NAND gate, the NOR gate also having an output coupled to the set input of the flip-flop.

18. The comparison circuit according to claim 17, wherein:
    the output of the flip-flop is coupled to a first auxiliary amplifier input and also to an input of a second inverter;
    an output of the second inverter is coupled to a first input of the multiplexer; and
    the complementary output of the flip-flop is coupled to a secondary auxiliary amplifier and also to a second input of the multiplexer.

19. The comparison circuit according to claim 1, wherein the input terminal is part of an input interface and the output terminal is part of an output interface.

20. A comparison circuit comprising:
an input terminal;
an output terminal;
a pre-amplifier stage having a signal input coupled to the input terminal and a reference signal input;
a gain amplifier stage having an input coupled to an output of the pre-amplifier stage; and
a latch stage having an input coupled to the gain amplifier stage and an output coupled to the output terminal, wherein the latch stage comprises:
a comparator having an output coupled to the output of the latch stage, the comparator comprising a flip-flop, and
a compensation circuit having an output coupled to an input of the comparator and an input coupled to the input of the latch stage, the compensation circuit comprising logic circuitry coupled to the flip-flop and to an output of the gain amplifier stage, a digital to analog converter with an input coupled to an output of the flip-flop, a multiplexer having an input coupled to the output of the flip-flop, and an auxiliary amplifier with an input coupled to an output of the digital to analog circuit and an output coupled to the logic circuitry, the auxiliary amplifier configured to have a first propagation delay that is within a predetermined tolerance level of a second propagation delay from the input terminal to the output terminal.

21. The comparison circuit according to claim 20, wherein the predetermined tolerance level is 5%.

22. The comparison circuit according to claim 20, wherein the flip-flop has an input coupled to the output of the compensation circuit, and an output coupled to the auxiliary amplifier.

* * * * *